United States Patent
Chenakin

(10) Patent No.: US 12,431,842 B2
(45) Date of Patent: Sep. 30, 2025

(54) OSCILLATOR WITH PHASE-NOISE CANCELLATION

(71) Applicant: Anritsu Company, Morgan Hill, CA (US)

(72) Inventor: Oleksandr Chenakin, Morgan Hill, CA (US)

(73) Assignee: Anritsu Company, Morgan Hill, CA (US)

( * ) Notice: Subject to any disclaimer, the term of this patent is extended or adjusted under 35 U.S.C. 154(b) by 0 days.

(21) Appl. No.: 18/240,048

(22) Filed: Aug. 30, 2023

(65) Prior Publication Data

US 2025/0080121 A1 Mar. 6, 2025

(51) Int. Cl.
*H03B 5/18* (2006.01)
*H03B 27/00* (2006.01)

(52) U.S. Cl.
CPC ........... *H03B 5/1882* (2013.01); *H03B 27/00* (2013.01); *H03B 2201/0241* (2013.01)

(58) Field of Classification Search
CPC ...... H03B 2202/076; H03B 2200/0088; H03B 2200/009; H03B 2201/0241; H03B 5/1882; H03B 5/1888; H03B 5/1894; H03B 9/142; H03B 27/00; H03L 7/00; H03L 7/099

See application file for complete search history.

(56) References Cited

U.S. PATENT DOCUMENTS

| | | | | |
|---|---|---|---|---|
| 4,555,678 A * | 11/1985 | Galani | ................. | H03B 5/1894 331/1 A |
| 7,075,378 B2 * | 7/2006 | Howe | ..................... | H03L 7/081 331/96 |
| 2005/0275479 A1 * | 12/2005 | Sutton | ....................... | H03L 7/23 331/154 |

* cited by examiner

*Primary Examiner* — Ryan Johnson
(74) *Attorney, Agent, or Firm* — Kilpatrick Townsend & Stockton LLP

(57) ABSTRACT

Circuits, methods, and apparatus that can provide oscillator circuits that have reduced phase noise. An example can provide a yttrium-iron-garnet oscillator in a loop with a loop amplifier and a phase-shift circuit. The yttrium-iron-garnet oscillator can act as a resonator. Quadrature outputs of the yttrium-iron-garnet oscillator can drive a phase detector that can provide a control signal to the phase-shift circuit. The phase-shift circuit can then reduce or cancel phase noise in the loop, thereby enabling the loop to provide a reference signal having reduced phase noise.

18 Claims, 7 Drawing Sheets

OSCILLATOR WITH PHASE-NOISE CANCELLATION

BACKGROUND

Wireless communication has become ubiquitous in daily life. Cell phones, computers, and home networks, as well as a growing array of smart and connected devices, such as speakers, lights, and home appliances, all communicate wirelessly. The wireless communication systems for these devices, as well as for other systems such as radar and data conversion systems, can be tested using signal generation equipment.

Signal generation equipment can include one or more frequency synthesizers. A frequency synthesizer is an electronic system that translates an input reference signal to an output signal at a different frequency. The input reference frequency can be provided by a crystal or other temperature insensitive oscillator. The output signal can be provided to a circuit or system being tested.

The output signal from a frequency synthesizer can have an amount of phase noise, where the phase noise is a manifestation of instability of the output frequency of the frequency synthesizer and is observed as random frequency fluctuations around the desired output frequency. This phase noise can include phase noise from the oscillator generating the reference input signal as well as the following frequency synthesizer.

Phase noise can be a limiting factor in the sensitivity of tests being performed on a device. For example, it can be difficult to determine whether noise in a test result is due to the test system or the device being tested. As a result, it can be desirable to reduce the phase noise at an output of a frequency synthesizer. In particular, it can be desirable to reduce the phase noise in a reference signal provided by an oscillator.

Thus, what is needed are circuits, methods, and apparatus that can provide oscillator circuits that have reduced phase noise.

SUMMARY

Accordingly, embodiments of the present invention can provide circuits, methods, and apparatus that can provide oscillator circuits that have reduced phase noise. An illustrative embodiment of the present invention can include a yttrium-iron-garnet oscillator. This yttrium-iron-garnet oscillator can provide a narrow-band resonator, can filter out-of-band noise, and can provide quadrature outputs that can be used for phase correction.

An illustrative embodiment of the present invention can provide a phase-shift circuit in an oscillator loop with a loop amplifier and a resonator. The phase-shift circuit can act to reduce or cancel phase noise in the loop thereby enabling the loop to provide a reference signal having reduced phase noise. The phase-shift circuit can have a control input driven by a signal that tracks a phase difference between quadrature outputs of the resonator. The phase-shift circuit can provide a variable phase shift that varies around a nominal phase-shift of 90 degrees. The loop amplifier can provide gain for the loop to enable a sustained oscillation. The resonator can include an input, a narrow-band filter, an in-phase output, and a quadrature output. The in-phase output and the quadrature output can be separated by 90 degrees. That is, the quadrature output can be phase shifted by 90 degrees relative to the input signal. The 90 degrees provided by the quadrature output and the nominal 90 degree phase shift provided by the phase-shift circuit can provide the 180 degree inversion needed for oscillation. The in-phase output and the quadrature output can be received at inputs of a phase detector. The output of the phase detector can be provided to a control input of the phase-shift circuit. An amplifier can be used to increase the signal strength from the phase-detector. A radio-frequency (RF) coupler can be used to provide isolation for the oscillator circuit from a load that is being driven, such as a phase-locked loop or frequency synthesizer.

In these and other embodiments of the present invention, the resonator can be a yttrium-iron-garnet oscillator. The yttrium-iron-garnet oscillator can include a yttrium-iron-garnet sphere with a first coupling coil and a second coupling coil at least partially around the yttrium-iron-garnet sphere. An input can be provided to the first coupling coil on a first side of the yttrium-iron-garnet sphere. An in-phase output can be provided on the first coupling coil on a second side of the yttrium-iron-garnet sphere the second side opposite the first side. Energy from a high-frequency RF or microwave signal can inductively couple from the first coupling coil through the yttrium-iron-garnet sphere to a second coupling coil. The second coupling coil can be grounded on a third side of the yttrium-iron-garnet sphere, the third side between the first side and the second side, and a quadrature output can be provided on the second coupling coil on a fourth side of the yttrium-iron-garnet sphere, the fourth side opposite the third side. One of the coupling coils can loop over the yttrium-iron-garnet sphere while the other can loop under the yttrium-iron-garnet sphere.

The yttrium-iron-garnet oscillator can provide at least three functions for the oscillator circuit. First, the yttrium-iron-garnet oscillator can provide a narrow-band response in the RF or microwave frequency range to an input signal, where the narrow-band response helps to reduce the presence of harmonics in the output signal. Second, the narrow-band response provided by the yttrium-iron-garnet oscillator can sample the noise generated by the phase-shift circuit and the loop amplifier and can limit out-of-band noise. Third, the yttrium-iron-garnet oscillator can act as a phase splitter to provide quadrature outputs that can be used to generate a control signal to enable the phase-shift circuit to reduce phase noise in the oscillator circuit.

For example, an input signal can be received by the yttrium-iron-garnet oscillator on a first coupling coil, and the yttrium-iron-garnet oscillator can act as a phase-splitter such that an in-phase output signal can be provided on a first coupling coil and a quadrature output signal can be provided on the second coupling coil. The frequency response of the yttrium-iron-garnet oscillator can provide a narrow-band frequency response limiting the spectrum of the quadrature outputs. This narrow-band response can limit noise and harmonics on the quadrature outputs.

These and other embodiments of the present invention can provide an oscillator circuit having an oscillator loop that includes a phase-shift circuit, a loop amplifier, and a resonator circuit. This loop can provide the gain and the 180 degree phase shift needed to sustain oscillations. The phase-shift circuit can provide a nominal 90 degree phase shift. The time delay needed to provide a 90 degree-phase shift can vary with frequency, therefore the phase-shift circuit can be adjustable over a range of possible delays. The 90 degree phase shift provided by the phase-shift circuit can be varied to cancel phase fluctuations or phase noise in the oscillator loop. For example, the phase-shift circuit can be controlled using a control input to have a phase shift less than or greater than 90 degrees as needed. The loop amplifier can provide gain such that the oscillator loop has a gain over one, which is required for oscillation. The resonator can provide in-phase and quadrature outputs. The quadrature output can have a 90 degree phase shift relative to an input signal. The 90 degree phase shift provided by the resonator along with the 90 degree nominal phase shift provided by the phase-shift circuit can combine to provide the 180 degree phase shift needed for oscillation of the oscillation loop.

These and other embodiments of the present invention can provide an oscillator circuit having a feedback loop to reduce phase noise in the oscillator loop. The in-phase and quadrature outputs can be received at inputs of a phase detector. The phase detector can provide a voltage or other signal that is proportional to phase fluctuations or phase noise in the quadrature outputs of the yttrium-iron-garnet oscillator. The output of the phase detector can be received at a control input of the phase-shift circuit, which can then vary the phase shift provided by the phase-shift circuit in a direction to reduce the phase noise in the oscillator loop. The output of the phase detector can be gained or amplified by a second amplifier having an input coupled to an output of the phase detector and an input coupled to a control input of the phase-detector. The control signal can optionally be filtered as well.

In these and other embodiments of the present invention, the loop components of the oscillator circuit can be positioned differently. For example, the output of the phase-shift circuit can be coupled to an input of the loop amplifier, which can have an output coupled to the input of the yttrium-iron-garnet oscillator, where an output of the yttrium-iron-garnet oscillator can be coupled back to an input of the phase-shift circuit. As another example, the output of the loop amplifier can be coupled to an input of the phase-shift circuit, which can have an output coupled to the input of the yttrium-iron-garnet oscillator, where an output of the yttrium-iron-garnet oscillator can be coupled back to an input of the loop amplifier.

The yttrium-iron-garnet oscillator can be tuned in various ways in this and other embodiments of the present invention. For example, a variable magnetic field can be applied to the yttrium-iron-garnet sphere in the yttrium-iron-garnet oscillator. The variable magnetic field can be provided by changing a current through an electromagnet. The variable magnetic field can be provided by switching coils in and out of an electromagnet, for example using relays. The variable magnetic field can be provided by moving a fixed or permanent magnet relative to the yttrium-iron-garnet sphere. The variable magnetic field can be provided by changing an aperture of an opening a magnetic shield or shunt, where the opening is between a magnet and the yttrium-iron-garnet sphere.

Various embodiments of the present invention can incorporate one or more of these and the other features described herein. A better understanding of the nature and advantages of the present invention can be gained by reference to the following detailed description and the accompanying drawings.

DESCRIPTION OF ILLUSTRATIVE EMBODIMENTS

Figure 1:
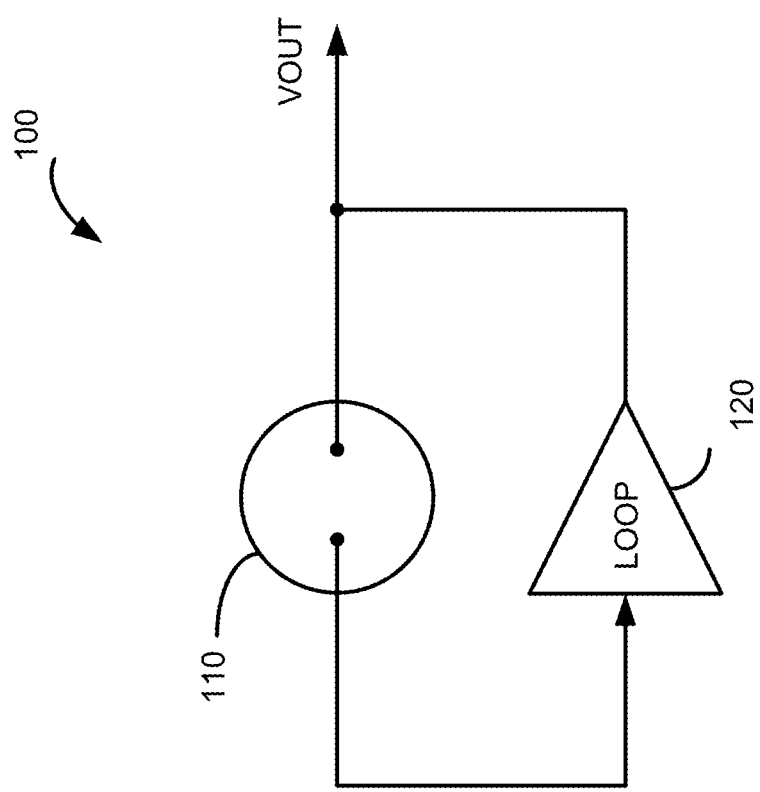
FIG. 1 illustrates an oscillator circuit that can be improved by embodiments of the present invention.

FIG. 1 illustrates an oscillator circuit that can be improved by embodiments of the present invention. Oscillator circuit 100 can include resonator 110 driven by loop amplifier 112. Resonator 110 can provide a narrow-band frequency response, where is peak of the narrow-band frequency response is the frequency of operation for oscillator circuit 100. Loop amplifier 120 can provide gain such that oscillator circuit 100 can provide an oscillating signal on line VOUT. In this example, loop amplifier 120 can provide a 180 degree inversion and a gain greater than one as needed for a sustained oscillation.

There can be phase noise generated by oscillator circuit 100 that can appear at the output VOUT. This phase noise can mostly be generated by flicker and other noise from loop amplifier 120. Resonator 110 can filter much of the noise generated by loop amplifier 120, though in-band noise can pass through resonator 110 and be amplified by loop amplifier 120.

Accordingly, embodiments of the present invention can provide circuits, methods, and apparatus that can help to reduce or cancel this phase noise. An embodiment of the present invention can provide a phase-shift circuit in the oscillator loop of an oscillator circuit. The oscillator loop can also include a resonator and a loop amplifier in series with the phase-shift circuit. The phase-shift circuit can provide a variable phase where the phase tracks a voltage on a control input of the phase-shift circuit. The resonator can provide quadrature outputs that are received at inputs of a phase detector. The phase detector can generate a voltage that follows an error from 90 degrees in the phase difference at the quadrature outputs. The phase detector output can be provided to the control input of the phase-shift circuit, either directly, or after being amplified, filtered, or a combination thereof. An example is shown in the following figure.

Figure 2:
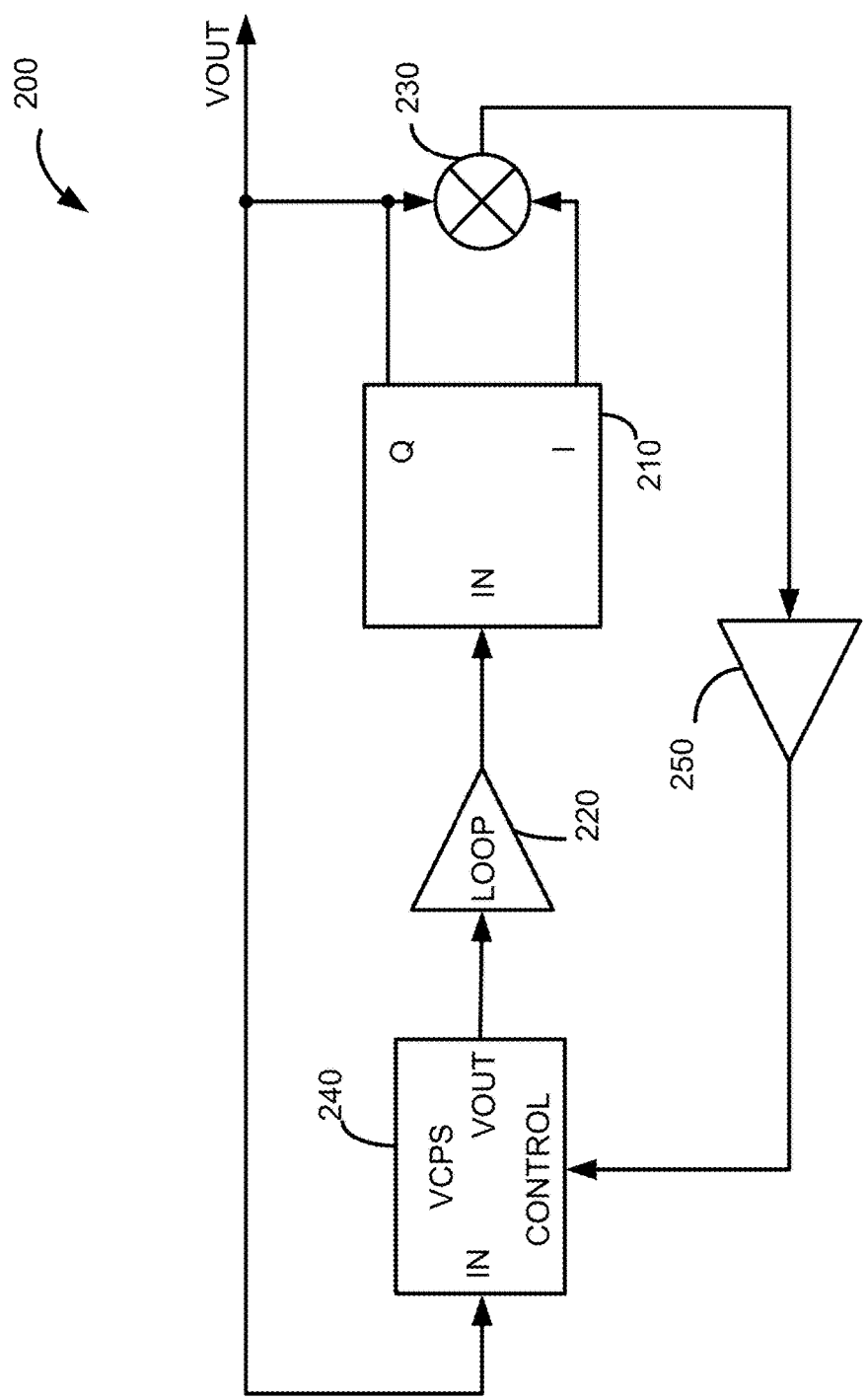
FIG. 2 illustrates an oscillator circuit accordingly to an embodiment of the present invention.

FIG. 2 illustrates an oscillator circuit accordingly to an embodiment of the present invention. Oscillator circuit 200 can include an oscillator loop that includes phase-shift circuit 240, loop amplifier 220, and resonator 210. Oscillator circuit 200 can further include a feedback loop that includes phase detector 230 and second amplifier 250.

Phase-shift circuit 240 can be a voltage-controlled phase-shift circuit or other type of phase-shift circuit. A control signal provided by phase detector 230 and amplified by second amplifier 250 can be received at a control input of phase-shift circuit 240. Phase-shift circuit 240 can provide a nominal 90 degree phase shift and the control signal at the control input can adjust an amount of phase delay that phase-shift circuit 240 provides in a varying amount to cancel or reduce phase noise present at the outputs of resonator 210. Phase-shift circuit 240 can include voltage varying capacitors, such as varactors, or other voltage dependent passive or active components. Phase-shift circuit 240 can include tuning circuitry such that phase-shift circuit 240 is capable of providing a nominal 90 degree phase shift over a wide range of frequencies.

Loop amplifier 220 can provide gain for the oscillator loop such that oscillator circuit 200 provides an oscillating waveform VOUT. Loop amplifier 220 can also gain or amplify noise that it receives and can contribute additional noise as well. This noise can appear as phase fluctuations or phase noise at VOUT.

Resonator 210 can include an input terminal IN. Resonator 210 can provide at least three features. First, resonator 210 can include a narrow-band band-pass filter having a pass-band in the RF or microwave frequency range. The narrow-band frequency response of resonator 210 can help to reduce the amplitude of harmonic components at VOUT, the output of the oscillator loop. Second, the narrow-band frequency characteristic of resonator 210 can filter out-of-band noise at the output of resonator 210. Third, resonator 210 can act as a phase-splitter to provide two output signals that are in quadrature with each other. For referential purposes, these two quadrature outputs can be labeled as an in-phase output at output I and a quadrature output at output Q. As shown below, resonator 210 can be implemented as a yttrium-iron-garnet oscillator.

Phase detector 230 can have two inputs that receive the quadrature outputs from resonator 210. Phase detector 230 can provide an output signal that can track a phase error from quadrature between the two outputs of resonator 210. That is, when the two output signals are in quadrature, phase detector 230 can provide a null signal. As the phase difference between the in-phase and quadrature outputs of the resonator 210 increases above 90 degrees, the output of phase detector can have a first polarity and can increase in magnitude, while when the phase difference between the in-phase and quadrature outputs of the resonator 210 decreases below 90 degrees, the output of phase detector can have a second polarity and can increase in magnitude. The polarity can be configured to operate with the control input circuit of phase-shift circuit 240. Phase detector 230 can be a balanced mixer, a Gilbert gain cell, or other type of mixer.

Second amplifier 250 can gain or amplify the output signal from phase detector 230. Second amplifier 250 can be formed as part of phase detector 230, as part of phase-shift circuit 240, or second amplifier 250 can be a stand-alone amplifier as shown.

In this example, loop amplifier 220 can provide a signal to the input IN of resonator 210. Loop amplifier 220 can provide a non-inverting gain such that the gain around the oscillator loop is greater than one as needed for sustained oscillation. The input signal can be an RF or microwave signals. Resonator 210 can filter the input signal with its narrow-band frequency response and provide quadrature outputs. The quadrature output can be provided to the input IN of the phase-shift circuit 240. In this way, the resonator 210 can provide a 90 degree phase shift. This 90 degree phase sift when combined with the nominal phase shift of 90 degrees of phase-shift circuit 240 provides the 180 degree inversion needed for sustained oscillation. The in-phase I and quadrature Q outputs of the resonator 210 can be received at inputs of phase detector 230. The output of phase detector 230 can track a phase difference from quadrature between the I and Q outputs. The output of phase detector 230 can be amplified by second amplifier 250 and provided to the control input of the phase-shift circuit 240. A delay through phase-shift circuit 240 can be varied by the signal at the control input. This delay can be varied to reduce or cancel the phase fluctuations or phase error present in the loop and can enable phase-shift circuit 240 to provide an output having reduced phase noise to loop amplifier 220. This can help to reduce the phase noise at the output VOUT of oscillator circuit 200.

In these and other embodiments of the present invention, resonator 210 can be implemented using a yttrium-iron-garnet oscillator. Other types of oscillators that have been, are being, or will be developed, can also be used. Examples are shown in the following figures.

Figure 3:
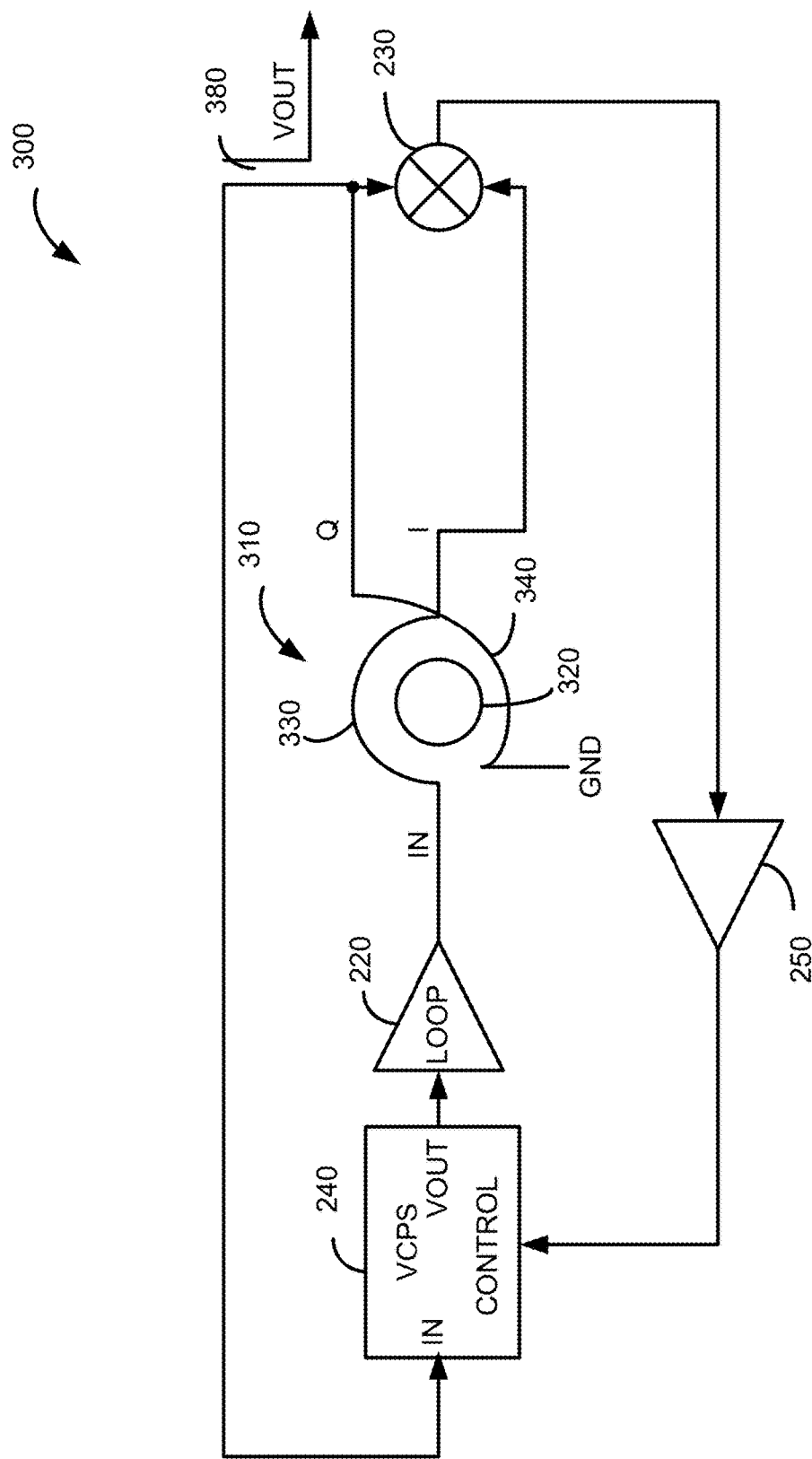
FIG. 3 illustrates another oscillator circuit accordingly to an embodiment of the present invention.

FIG. 3 illustrates another oscillator circuit accordingly to an embodiment of the present invention. Oscillator circuit 300 can include an oscillator loop that includes phase-shift circuit 240, loop amplifier 220, and yttrium-iron-garnet oscillator 310. Oscillator circuit 300 can further include a feedback loop that includes phase detector 230 and second amplifier 250.

Yttrium-iron-garnet oscillator 310 can receive an input signal on first coupling coil 330. Energy on the first coupling coil 330 can pass through yttrium-iron-garnet sphere to second coupling coil 340. Output signals can be provided on first coupling coil 330 and second coupling coil 340. These signals can be labeled for referential purposes as the in-phase output signal I and the quadrature output signal Q.

Yttrium-iron-garnet oscillator 310 can include a first coupling coil 330, second coupling coil 340, and yttrium-iron-garnet sphere 320. First coupling coil 330 can be coupled to receive an input signal from loop amplifier 220 on a first side of yttrium-iron-garnet sphere 320 and to provide the in-phase output on a second side of yttrium-iron-garnet sphere 320, the second side opposite the first side. Second coupling coil 340 can be coupled to ground on a third side of yttrium-iron-garnet sphere 320, the third side between the first side and the second side, and to provide the in-phase output on a fourth side of yttrium-iron-garnet sphere 320, the fourth side opposite the third side. First coupling coil 330 can loop over yttrium-iron-garnet sphere 320 while second coupling coil 340 can loop under yttrium-iron-garnet sphere 320. First coupling coil 330 and second coupling coil 340 can be positioned around yttrium-iron-garnet sphere 320 such that energy is inductively coupled between them through the yttrium-iron-garnet sphere 320.

Yttrium-iron-garnet oscillator 310 can provide a very narrow pass-band frequency response due to its very high Q characteristic. The limited range of frequencies passed can help to reduce the signal strength of harmonics in the output signal VOUT. The limited range of frequencies passed can reduce the out-of-band noise provided to the yttrium-iron-garnet oscillator 310 by loop amplifier 220.

In this example, loop amplifier 220 can provide a signal to the input IN of yttrium-iron-garnet oscillator 310. Loop amplifier 220 can provide the gain greater than one for the oscillator loop as needed for oscillation. The input signal can be an RF or microwave signal. Yttrium-iron-garnet oscillator 310 can filter the input signal with its narrow-band frequency response and provide quadrature outputs. The quadrature output can be provided to the input IN of the phase-shift circuit 240. The quadrature output can provide a 90 degree phase shift, while phase-shift circuit can provide another nominal 90 degree phase shift. This combination can provide the 180 degree inversion needed for sustained oscillation. The in-phase I and quadrature Q outputs of yttrium-iron-garnet oscillator 310 can be received at inputs of phase detector 230. The output of phase detector 230 can track a phase difference from quadrature between the I and Q outputs. The output of phase detector 230 can be amplified by second amplifier 250 and provided to the control input of the phase-shift circuit 240. Phase-shift circuit 240 can delay the signal provided by the quadrature output Q of yttriumiron-garnet oscillator 310 and provide an input to loop amplifier 220. A delay through phase-shift circuit 240 can be varied by the control signal at the control input. This delay can be varied to reduce or cancel the phase fluctuations or phase error present in the loop and can enable phase-shift circuit 240 to provide an output having reduced phase noise to loop amplifier 220. The output of phase detector 230 can track a phase difference from quadrature between the I and Q outputs. The output of phase detector can be null when the I and Q outputs are in quadrature. As the phase between the I and Q outputs increase over 90 degrees, the output of the phase detector can increase in magnitude and have a first polarity. As the phase between the I and Q outputs decreases below 90 degrees, the output of the phase detector can increase in magnitude and have a second polarity. The first and second polarities can be set for compatibility with the control input of phase-shift circuit 240. This can help to reduce the phase noise at the output VOUT of oscillator circuit 200. Oscillator circuit 200 can be isolated from a phase-locked loop, frequency synthesizer, or other load by RF coupler 380.

The various components shown in this figure can be arranged in different configurations consistent with embodiments of the present invention. An example is shown in the following figure.

Figure 4:
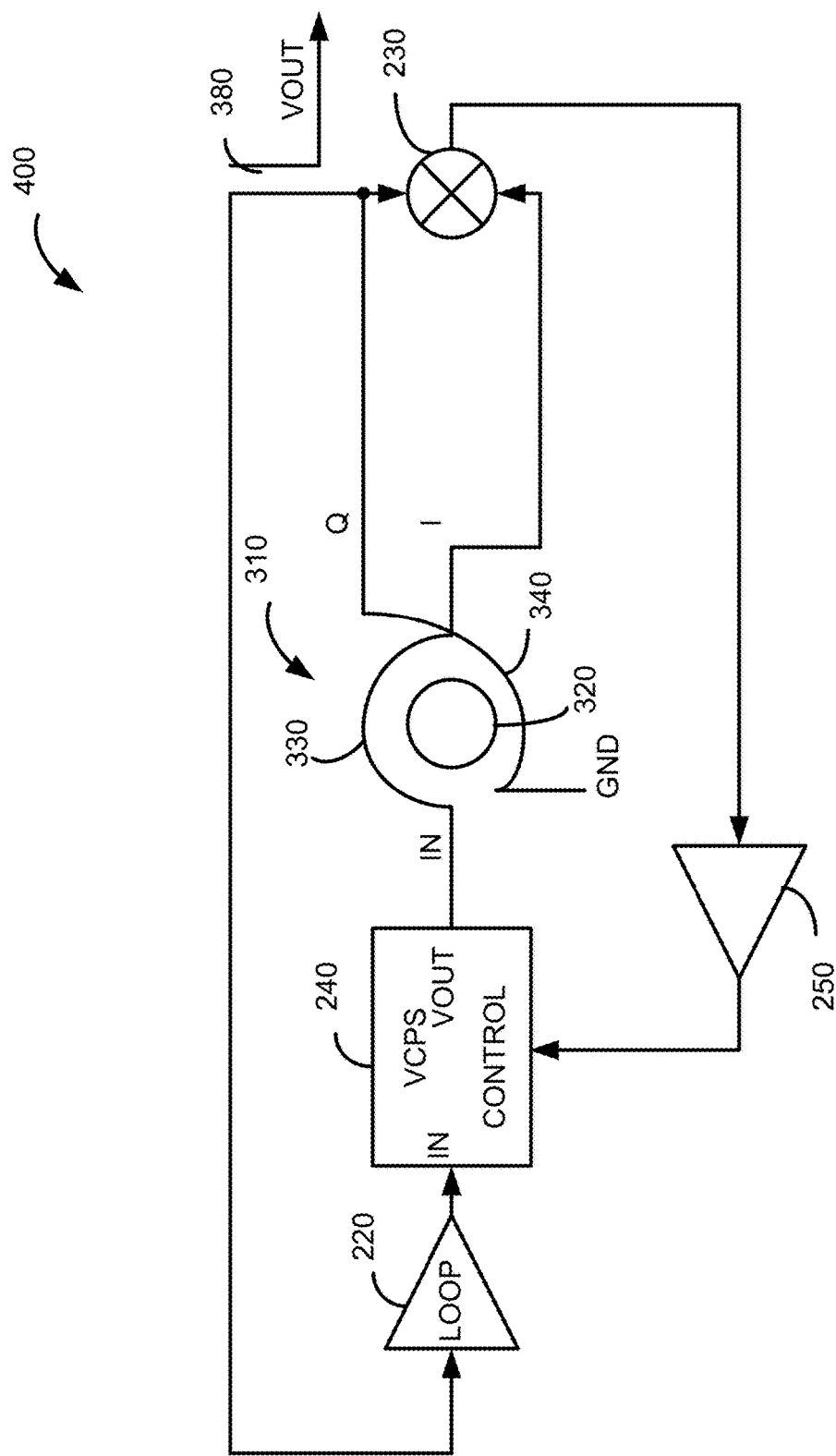
FIG. 4 illustrates another oscillator circuit accordingly to an embodiment of the present invention.

FIG. 4 illustrates another oscillator circuit accordingly to an embodiment of the present invention. Oscillator circuit 400 can include an oscillator loop that includes phase-shift circuit 240, loop amplifier 220, and yttrium-iron-garnet oscillator 310. Oscillator circuit 300 can further include a feedback loop that includes phase detector 230 and second amplifier 250. In this example, loop amplifier 220 can be placed before phase-shift circuit 240.

In this example, loop amplifier 220 can provide a gain for the oscillator loop such that the oscillator loop has a gain over one as needed for oscillation. Loop amplifier 220 can drive or provide an input to phase-shift circuit 240, which can provide a signal to the input IN of yttrium-iron-garnet oscillator 310. The input signal can be an RF or microwave signal. Yttrium-iron-garnet oscillator 310 can filter the input signal with its narrow-band frequency response and provide quadrature outputs. The quadrature output Q can be provided to the input of loop amplifier 220. The in-phase I and quadrature Q outputs of yttrium-iron-garnet oscillator 310 can be received at inputs of phase detector 230. The output of phase detector 230 can be amplified by second amplifier 250 and provided to the control input of the phase-shift circuit 240. A delay through phase-shift circuit 240 can be varied by the control signal at the control input. This delay can be varied to reduce or cancel the phase fluctuations or phase error present in the loop and can enable phase-shift circuit 240 to provide an output having reduced phase noise to loop amplifier 220. For example, the delay can be varied from a nominal 90 degree phase shift. The output of phase detector 230 can track a phase difference from quadrature between the I and Q outputs. The output of phase detector can be null when the I and Q outputs are in quadrature. As the phase between the I and Q outputs increase over 90 degrees, the output of the phase detector can increase in magnitude and have a first polarity. As the phase between the I and Q outputs decreases below 90 degrees, the output of the phase detector can increase in magnitude and have a second polarity. The first and second polarities can be set for compatibility with the control input of phase-shift circuit 240. This can help to reduce the phase noise at the output VOUT of oscillator circuit 200. Oscillator circuit 200 can be isolated from a phase-locked loop, frequency synthesizer, or other load by RF coupler 380.

Figure 5:
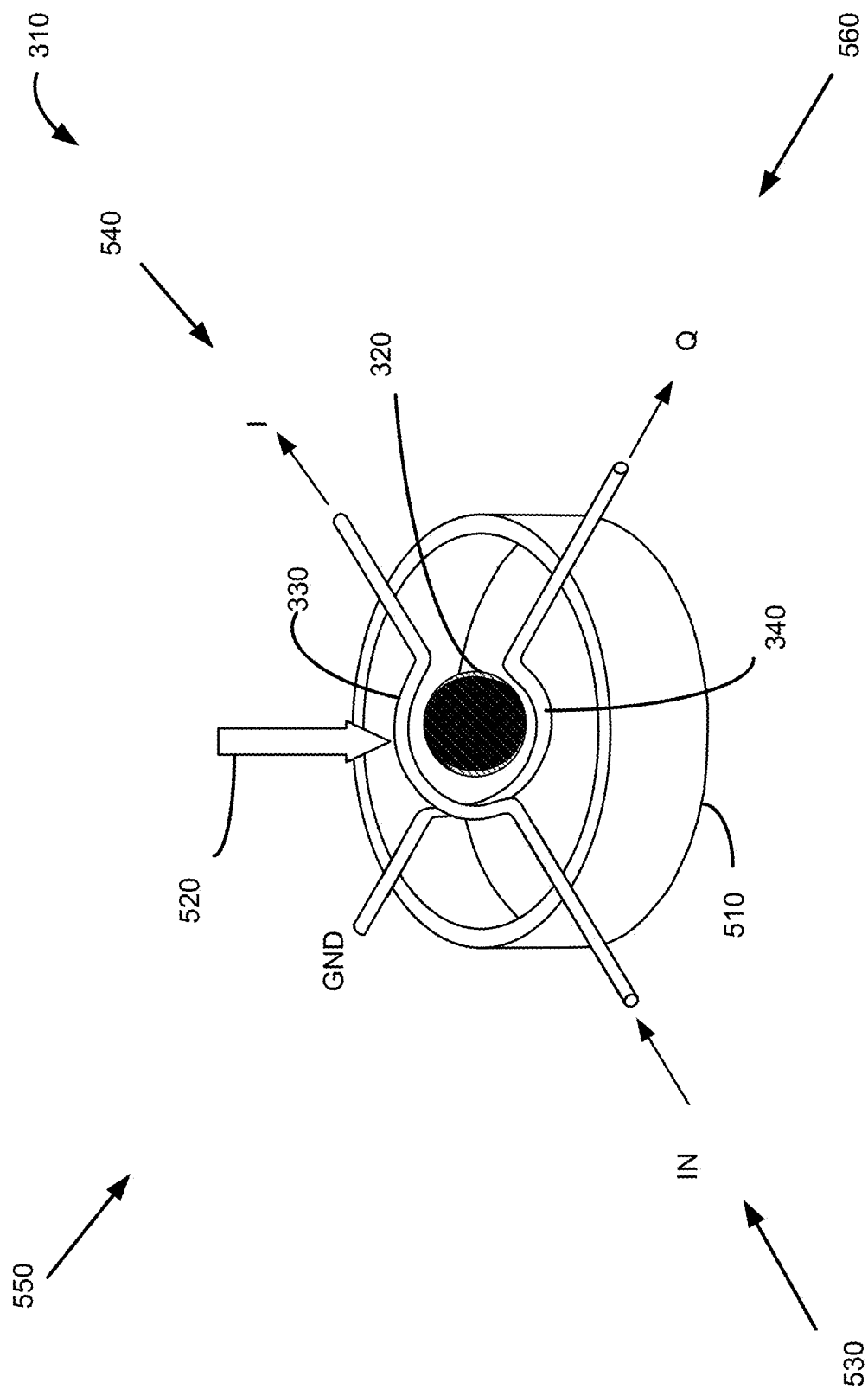
FIG. 5 illustrates a yttrium-iron-garnet oscillator that can be used in embodiments of the present invention.

FIG. 5 illustrates a yttrium-iron-garnet oscillator that can be used in embodiments of the present invention. Yttrium-iron-garnet oscillator 310 can include a first coupling coil 330 and a second coupling coil 340 at least partially around yttrium-iron-garnet sphere 320. Energy from first coupling coil 330 can be transferred through yttrium-iron-garnet sphere 320 to second coupling coil 340.

First coupling coil 330 can be coupled to receive an input signal IN on a first side 530 of yttrium-iron-garnet sphere 320 and to provide the in-phase output on a second side 540 of yttrium-iron-garnet sphere 320, the second side 540 opposite the first side 530. Second coupling coil 340 can be coupled to ground on a third side 550 of yttrium-iron-garnet sphere 320, the third side 550 between the first side 530 and the second side 540, and to provide the quadrature output on a fourth side 560 of yttrium-iron-garnet sphere 320, the fourth side 560 opposite the third side 550. First coupling coil 330 and second coupling coil 340 can be positioned around yttrium-iron-garnet sphere 320 such that energy is inductively coupled between them through the yttrium-iron-garnet sphere 320. First coupling coil 330 can be coiled around a top of yttrium-iron-garnet sphere 320 while second coupling coil 340 can be coiled around a bottom of yttrium-iron-garnet sphere 320.

Yttrium-iron-garnet oscillator 310 can be housed in a housing 510. A magnetic field 520 can be applied to yttrium-iron-garnet sphere 320. Magnetic field 520 can be varied to tune an oscillator circuit using yttrium-iron-garnet oscillator 310, such as oscillator circuit 200, oscillator circuit 300, oscillator circuit 400, or other oscillator circuit consistent with an embodiment of the present invention. An example is shown in the following figure.

Figure 6:
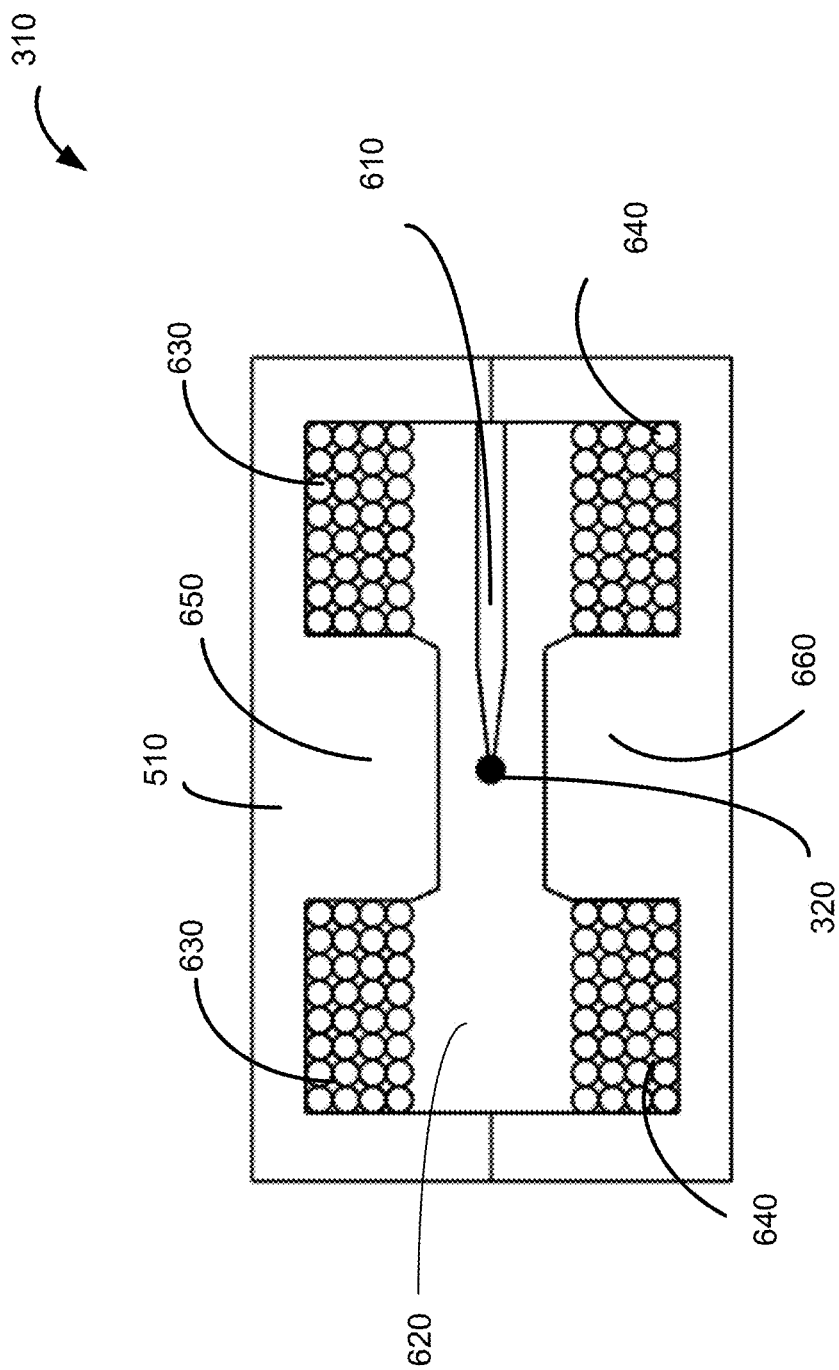
FIG. 6 illustrates a turning electromagnet for a yttrium-iron-garnet oscillator that can be used in embodiments of the present invention.

FIG. 6 illustrates a turning electromagnet for a yttrium-iron-garnet oscillator that can be used in embodiments of the present invention. Yttrium-iron-garnet oscillator 310 can include yttrium-iron-garnet sphere 320 held in place in housing 510 by holder 610. Housing 510 can also support or include core 650 and core 660. Core 650, core 660, and housing 510 can be formed separately or as a unitary structure. Core 650 and core 660 can be formed of iron, magnets, or other material. Windings 630 can be wrapped around core 650, while windings 640 can be wrapped around core 660. Current can be varied in windings 630, windings 640, or both, to vary magnetic field 520 (shown in FIG. 5) applied to yttrium-iron-garnet sphere 320. The center frequency of the band-pass characteristic of yttrium-iron-garnet oscillator 310 can be varied by varying magnetic field 520. This can vary the frequency of oscillation of an oscillator circuit, such as oscillator circuit 200, oscillator circuit 300, oscillator circuit 400, or other oscillator circuit consistent with an embodiment of the present invention.

In these and other embodiments of the present invention, the variable magnetic field can be provided by switching coils in and out of an electromagnet, for example using relays. A variable magnetic field can be provided by moving a fixed or permanent magnet relative to the yttrium-iron-garnet sphere. A variable magnetic field can be provided by changing an aperture of an opening a magnetic shield or shunt, where the opening is between a magnet and the yttrium-iron-garnet sphere.

In these and other embodiments of the present invention, some or all of the circuits shown such as loop amplifier 220, phase-shift circuit 240, phase detector 230, and second amplifier 250 can be formed as circuit modules, individual discrete transistors and components, one on or more integrated circuits, or as other types of electronic devices or a combination of these.

Figure 7:
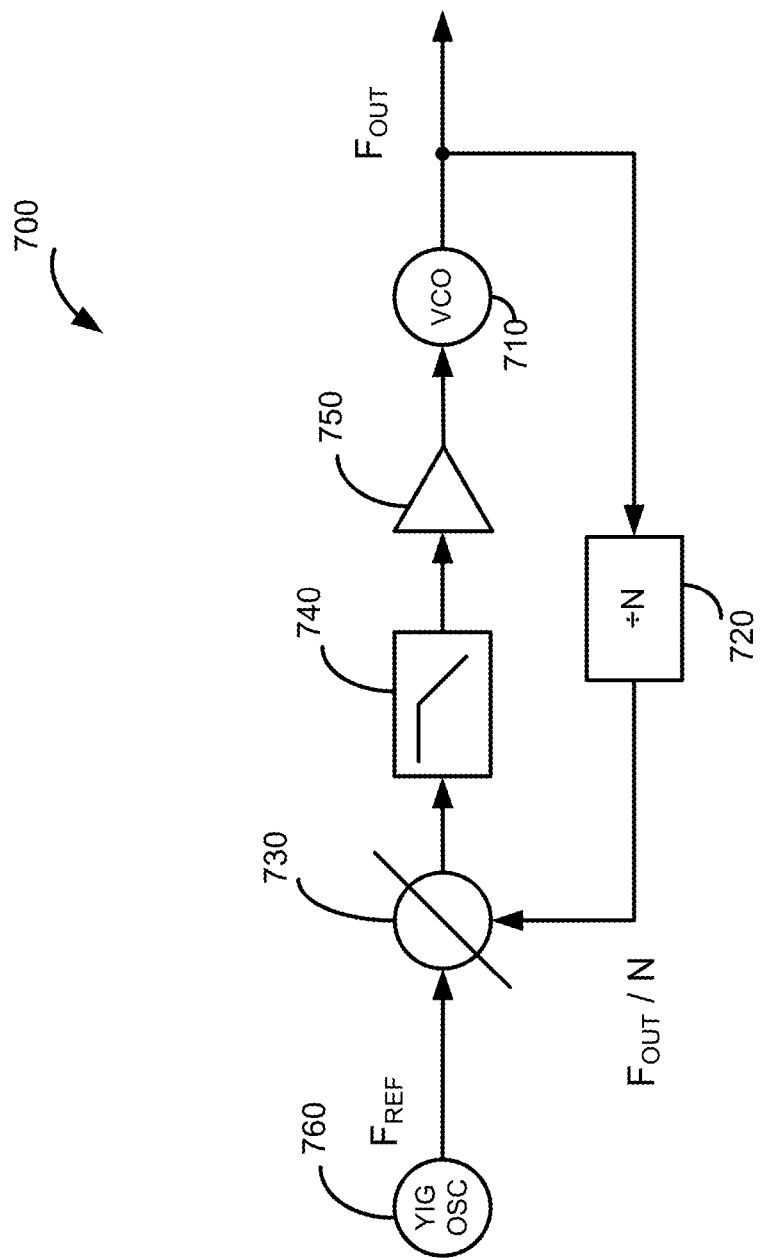
FIG. 7 illustrates a phase-locked loop that can be improved by the incorporation of embodiments of the present invention.

FIG. 7 illustrates a phase-locked loop that can be improved by the incorporation of embodiments of the present invention. Phase-locked loop 700 can be used as a frequency synthesizer. Alternatively, phase-locked loop 700 can be included as a portion of a frequency synthesizer, along with other signal processing circuits, reference signal generators, and other components or circuits.

Phase-locked loop 700 can include voltage-controlled oscillator 710. Voltage-controlled oscillator 710 can include a tank circuit formed of an inductor and a capacitor (not shown.) Alternatively, voltage-controlled oscillator 710 can be a ring oscillator formed of a number of circuits having a net inversion and connected in a loop, or voltage-controlled oscillator 710 can have a different topology or circuit configuration. Voltage-controlled oscillator 710 can provide an output signal having a frequency $F_{OUT}$.

Phase-locked loop 700 can include a feedforward path. This feedforward path can provide a reference signal having a frequency $F_{REF}$ to a first input of phase detector 730. The reference signal can be provided by an oscillator circuit 760, which can be the same as or similar to oscillator circuit 200, oscillator circuit 300, oscillator circuit 400, or other oscillator circuit consistent with an embodiment of the present invention.

Phase-locked loop 700 can include a feedback path from an output of the voltage-controlled oscillator 710 to a second input of phase detector 730. The feedback path can include a divider 720. Divider 720 can divide a frequency of the output signal out by an integer, represented here as the value N. The output of phase detector 730 can be filtered by lowpass filter 740. The output signal from lowpass filter 740 can be amplified by amplifier 750 and provided as a frequency control input to voltage-controlled oscillator 710. Phase-locked loop 700 can provide an output signal having a frequency $F_{OUT}$ that is N times the frequency $F_{REF}$ of the reference signal.

While the oscillator circuits shown here are well-suited to use in phase-locked loops, frequency synthesizers, and other circuits for RF test equipment, oscillator circuits provided by these and other embodiments of the present invention can be used in other types of circuits and equipment as well. Items having the same numbers in different figures can be the same or substantially the same circuits, though there can be differences as well that are not required for an understanding of embodiments of the present invention.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. An oscillator circuit comprising:
   a resonator circuit having an input, an in-phase output, and a quadrature output, wherein the resonator circuit comprises a yttrium-iron-garnet oscillator having a first coupling coil coupled between the input and the in-phase output, a second coupling coil coupled between ground and the quadrature output, and a yttrium-iron-garnet sphere between the first coupling coil and the second coupling coil;
   a phase detector having a first input coupled to the in-phase output of the resonator circuit and a second input coupled to the quadrature output of the resonator circuit;
   a phase-shift circuit having a control input coupled to an output of the phase detector; and
   a loop amplifier coupled to the resonator circuit and the phase-shift circuit.

2. The oscillator circuit of claim 1 further comprising a second amplifier having an input coupled to the output of the phase detector and an output coupled to the control input of the phase-shift circuit.

3. The oscillator circuit of claim 1 wherein an output of the phase-shift circuit is coupled to an input of the loop amplifier and an output of the loop amplifier is coupled to the input of the resonator circuit.

4. The oscillator circuit of claim 1 wherein an input of the phase-shift circuit is coupled to an output of the loop amplifier and an output of the phase-shift circuit is coupled to the input of the resonator circuit.

5. The oscillator circuit of claim 1 wherein the phase detector is a balanced mixer.

6. An oscillator circuit comprising:
   a yttrium-iron-garnet oscillator comprising a first coupling coil coupled between an input and a first output, a second coupling coil coupled between ground and a second output, and a yttrium-iron-garnet sphere between the first coupling coil and the second coupling coil, wherein the first output and the second output of the yttrium-iron-garnet oscillator provide quadrature signals;
   a loop circuit coupled around the yttrium-iron-garnet oscillator, the loop circuit comprising:
      a loop amplifier; and
      a phase-shift circuit, the loop amplifier and phase-shift circuit coupled in series and coupled to the input of the yttrium-iron-garnet oscillator; and
   a feedback loop comprising:
   a phase detector having a first input coupled to the first output of the yttrium-iron-garnet oscillator, a second input coupled to the second output of the yttrium-iron-garnet oscillator, and an output coupled to a control input of the phase-shift circuit.

7. The oscillator circuit of claim 6 wherein the feedback loop further comprises a second amplifier having an input coupled to an output of the phase detector and an output coupled to the control input of the phase-shift circuit.

8. The oscillator circuit of claim 6 wherein an output of the phase-shift circuit is coupled to an input of the loop amplifier and an output of the loop amplifier is coupled to the input of the yttrium-iron-garnet oscillator.

9. The oscillator circuit of claim 6 wherein an input of the phase-shift circuit is coupled to an output of the loop amplifier and an output of the phase-shift circuit is coupled to the input of the yttrium-iron-garnet oscillator.

10. The oscillator circuit of claim 6 wherein the yttrium-iron-garnet oscillator comprises the yttrium-iron-garnet sphere, and the yttrium-iron-garnet sphere provides a 90 degree phase shift between an in-phase signal on the first coupling coil and a quadrature signal on the second coupling coil.

11. The oscillator circuit of claim 6 wherein the output of the series of the phase-shift circuit and the loop amplifier is coupled to the first coupling coil of the yttrium-iron-garnet oscillator and an input of the series of the phase-shift circuit and the loop amplifier is coupled to the second coupling coil of the yttrium-iron-garnet oscillator.

12. The oscillator circuit of claim 6 wherein the phase detector is a balanced mixer.

13. A phase-locked loop comprising:
an oscillator circuit;
a first phase detector having a first input coupled to an output of the oscillator circuit;
a low-pass filter having an input coupled to an output of the first phase detector;
an amplifier having an input coupled an output of the low-pass filter;
a voltage controlled oscillator having an input coupled to an output of the amplifier; and
a divider having an input coupled to an output of the voltage controlled oscillator and an output coupled to a second input of the first phase detector, wherein the oscillator circuit comprises:
a yttrium-iron-garnet oscillator;
a loop circuit comprising a loop amplifier and a phase-shift circuit coupled between a first output of the yttrium-iron-garnet oscillator and an input of the yttrium-iron-garnet oscillator; and
a feedback loop comprising a second phase detector having a first input coupled to the first output of the yttrium-iron-garnet oscillator, a second input coupled to a second output of the yttrium-iron-garnet oscillator, and an output coupled to a control input of the phase-shift circuit.

14. The phase-locked loop of claim 13 wherein the feedback loop further comprises a second amplifier having an input coupled to an output of the second phase detector and an output coupled to the control input of the phase-shift circuit.

15. The phase-locked loop of claim 13 wherein an output of the loop circuit is coupled to a first coupling coil of the yttrium-iron-garnet oscillator and a second coupling coil of the yttrium-iron-garnet oscillator is coupled to an input of the loop circuit.

16. The phase-locked loop of claim 15 wherein an output of the phase-shift circuit is coupled to an input of the loop amplifier and an output of the loop amplifier is coupled to the first coupling coil of the yttrium-iron-garnet oscillator.

17. The phase-locked loop of claim 15 wherein an input of the phase-shift circuit is coupled to an output of the loop amplifier and an output of the phase-shift circuit is coupled to the first coupling coil of the yttrium-iron-garnet oscillator.

18. The phase-locked loop of claim 13 wherein the second phase detector is a balanced mixer.

\* \* \* \* \*